United States Patent
Kushibiki et al.

(10) Patent No.: US 8,642,136 B2
(45) Date of Patent: Feb. 4, 2014

(54) SUBSTRATE PROCESSING METHOD AND SUBSTRATE PROCESSING APPARATUS FOR PERFORMING A DEPOSITION PROCESS AND CALCULATING A TERMINATION TIME OF THE DEPOSITION PROCESS

(75) Inventors: Masato Kushibiki, Nirasaki (JP); Eiichi Nishimura, Nirasaki (JP); Akitaka Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1011 days.

(21) Appl. No.: 12/575,076

(22) Filed: Oct. 7, 2009

(65) Prior Publication Data

US 2010/0086670 A1   Apr. 8, 2010

(30) Foreign Application Priority Data

Oct. 8, 2008 (JP) .................................. 2008-261246

(51) Int. Cl.
*H05H 1/00* (2006.01)
*C23C 16/52* (2006.01)
*B05C 11/00* (2006.01)

(52) U.S. Cl.
USPC ............... 427/535; 427/8; 427/569; 118/665; 118/682

(58) Field of Classification Search
USPC ................... 427/8, 9, 10, 535, 536, 537, 569; 216/58, 60; 118/665
See application file for complete search history.

(56) References Cited

U.S. PATENT DOCUMENTS

| 6,541,388 | B1 | 4/2003 | Saito |
|---|---|---|---|
| 6,625,512 | B1* | 9/2003 | Goodwin ...................... 700/121 |
| 2007/0039548 | A1* | 2/2007 | Johnson ........................ 118/665 |
| 2007/0163995 | A1 | 7/2007 | Sugimoto et al. |
| 2007/0195684 | A1* | 8/2007 | Kim et al. .................. 369/275.1 |
| 2007/0284337 | A1* | 12/2007 | Mochizuki et al. ............. 216/67 |

FOREIGN PATENT DOCUMENTS

| JP | 8-236506 | 9/1996 |
|---|---|---|
| JP | 2000-200783 A | 7/2000 |
| JP | 2001-85388 | 3/2001 |
| JP | 2002-110654 A | 4/2002 |
| JP | 2003-229414 A | 8/2003 |
| JP | 2007-194284 | 8/2007 |
| JP | 2007-273866 | 10/2007 |

* cited by examiner

*Primary Examiner* — William Phillip Fletcher, III
*Assistant Examiner* — Jose Hernandez-Diaz
(74) *Attorney, Agent, or Firm* — Rothwell, Figg, Ernst & Manbeck, P.C.

(57) ABSTRACT

A substrate processing method includes performing a deposition process of depositing a thin film on the substrate while depressurizing the inside of the processing chamber and introducing the gas thereinto; and, while the deposition process is being performed, irradiating light, which is transmitted through a monitoring window installed at the processing chamber, toward the inside of the processing chamber through the monitoring window, and monitoring a reflection light intensity of reflection light by receiving the reflection light through the monitoring window. The substrate processing method further includes measuring a temporal variation in the reflection light intensity during the deposition process and calculating a termination time of the deposition process based on a measurement value of the temporal variation; and terminating the deposition process by setting the termination time as an end point of the deposition process.

5 Claims, 8 Drawing Sheets

FIG. 7

START
↓
MONITORING THE REFLECTION LIGHT INTENSITY, WHILE THE DEPOSITION PROCESS IS BEING PERFORMED — S110
↓
MEASURING A TEMPORAL VARIATION (GRADIENT) OF REFLECTION LIGHT INTENSITY — S120
↓
CALCULATING A TERMINATION TIME OF THE DEPOSITION PROCESS BASED ON THE MEASUREMENT VALUE — S130
↓
FINISHING THE DEPOSITION PROCESS AT THE TERMINATION TIME — S140
↓
END

FIG. 8

| WAFER NO. | 1 | 2 | 5 | 12 | 25 |
|---|---|---|---|---|---|
| GRADIENT OF REFLECTION LIGHT INTENSITY | 2.22 | 2.25 | 2.33 | 2.38 | 2.41 |
| CD VARIATION (nm) | 0.9 | 0.25 | 1.37 | 1.64 | 2.27 |
| DIFFERENCE TO A REFERENCE VALUE OF EACH GRADIENT | 0.19 | 0.16 | 0.08 | 0.03 | 0 |
| ADJUSTMENT TIME | 32.5 | 32.1 | 31.1 | 30.4 | 30.0 |

SUBSTRATE PROCESSING METHOD AND SUBSTRATE PROCESSING APPARATUS FOR PERFORMING A DEPOSITION PROCESS AND CALCULATING A TERMINATION TIME OF THE DEPOSITION PROCESS

CROSS-REFERENCE TO RELATED APPLICATION

This application claims the benefit of priority to Japanese Patent Application No. 2008-261246, filed on Oct. 8, 2008, the entire contents of which are incorporated herein by reference.

FIELD OF THE INVENTION

The present invention relates to a substrate processing method and a substrate processing apparatus for performing a deposition process for depositing a thin film on a substrate such as a semiconductor wafer or an FPD substrate, and also relates to a storage medium storing a program for performing the substrate processing method.

BACKGROUND OF THE INVENTION

In a manufacturing process of a semiconductor device or a flat panel such as a liquid crystal display, patterns of desired microstructures (for example, holes or trenches) are formed on a substrate such as a semiconductor wafer or an FPD substrate by performing, e.g., a film forming process, an etching process, and the like on the substrate. Semiconductor devices tend to be getting further integrated year by year. Accordingly, to respond to the micronization of the patterns formed on the substrate, improvement in a resist material or an exposure technique has been sought for and an opening dimension of a resist pattern has been getting smaller.

With the progress in such micronization, when an etching target film on the substrate is etched by using a resist pattern as a mask, there arise problems of an over-enlargement in an opening dimension of the resist pattern or an over-etching of a sidewall of a recess in the etching target film. These result in a deviation of a critical dimension (CD) of a hole or a trench from a target value, such that device characteristics as designed may not be obtained.

To address this problem, there have been recently developed various techniques for forming a pattern having the opening dimension smaller than one of the resist pattern in the etching target film or preventing the critical dimension of the pattern formed on the etching target film from deviating from the target value by etching. The etching is conducted, for example, after the opening dimension of the resist pattern is made smaller by performing a deposition process for accumulating a deposit on the resist pattern for a certain period of time in advance (see, for example, Patent Documents 1 to 3).

Patent Document 1: Japanese Patent Laid-open Application No. 2007-194284
Patent Document 2: Japanese Patent Laid-open Application No. 2007-273866
Patent Document 3: Japanese Patent Laid-open Application No. 2006-236506
Patent Document 4: Japanese Patent Laid-open Application No. 2001-85388

However, it is known that when a same etching process is performed on substrates, there is a minute difference in critical dimensions of patterns formed after the etching process even if the deposition process is performed for the same period of time. It is deemed that there is generated a deviation in opening dimensions of resist patterns due to a subtle difference in the progress of deposition onto the substrates depending on, for example, conditions within a processing chamber in which the etching is performed.

Further, since such a deviation in critical dimensions is approximately several nanometers (nm) and has been conventionally regarded as falling within a tolerance, it has not caused a significant trouble. However, to comply with the requirement for further micronization of the patterns, such deviation cannot be neglected.

From this point of view, if a film thickness of a deposit accumulated on the substrate can be detected, a termination time of the deposition process can be controlled. Actually, however, it is very difficult to directly monitor the film thickness of the deposit accumulated on the substrate.

In case of an etching process, for example, a variation in a film thickness caused by etching may be directly monitored by way of irradiating light through a monitoring window installed in the processing chamber, detecting reflection light from the substrate through the monitoring window, and analyzing it (see, for example, Patent Document 4).

In case of the deposition process, however, since the deposit is accumulated on an inner sidewall of the processing chamber and/or on an inner side of the monitoring window (i.e., inner side of the processing chamber) as well as on the substrate, reflection light from the substrate cannot be detected accurately due to the presence of such deposit.

SUMMARY OF THE INVENTION

In view of the foregoing, the present invention provides a substrate processing method capable of controlling a termination time of a deposition process by indirectly monitoring a film thickness of a deposit accumulated on each substrate based on a film thickness of a deposit accumulated on a monitoring window when the deposition process is performed, thus suppressing a variation in film thicknesses of deposits on respective substrates.

The present inventors have paid attention to the fact that the deposit gets accumulated on the inner side of the monitoring window as well as on the substrate in the deposition process, and have found out that a temporal variation (gradient) of an intensity of reflection light, which is received when light is irradiated through the monitoring window, varies every time the deposition process is processed on each substrate, and is correlated with a variation in critical dimensions of structures formed after the etching process. Based on this fact, in the present invention to be described later, a termination time of the deposition process is calculated based on the temporal variation of the reflection light intensity, whereby a deposit can be accumulated on each substrate in an appropriate thickness.

In accordance with a first aspect of the present invention, there is provided a substrate processing method of performing a process on a substrate disposed on a lower electrode, by generating a plasma of gas by way of applying a high frequency power between an upper electrode and the lower electrode installed to face each other in a processing chamber that is capable of being depressurized, the method includes performing a deposition process of depositing a thin film on the substrate while depressurizing the inside of the processing chamber and introducing the gas thereinto; and, while the deposition process is being performed, irradiating light, which is transmitted through a monitoring window installed at the processing chamber, toward the inside of the processing chamber through the monitoring window, and monitoring a reflection light intensity of reflection light by receiving the reflection light through the monitoring window.

The substrate processing method of the first aspect of the invention further includes measuring a temporal variation in the reflection light intensity during the deposition process and calculating a termination time of the deposition process based on a measurement value of the temporal variation; and terminating the deposition process by setting the termination time as an end point of the deposition process.

In accordance with a second aspect of the present invention, there is provided a substrate processing apparatus for performing a process on a substrate disposed on a lower electrode, by generating plasma of a gas by way of applying a high frequency power between an upper electrode and the lower electrode installed to face each other in a processing chamber that is capable of being depressurized, the apparatus includes a power supply unit for applying the high frequency power to the lower electrode; a gas supply unit for supplying a gas into the processing chamber; an exhaust unit for evacuating and depressurizing the inside of the processing chamber to a certain pressure; a monitoring window installed in the processing chamber; and an optical device for monitoring a reflection light intensity by irradiating light that is transmitted through the monitoring window, and receiving reflection light thereof through the monitoring window.

The substrate processing apparatus of the second aspect of the invention further includes a control unit for depressurizing the inside of the processing chamber by the exhaust unit, supplying the gas from the gas supply unit, generating the plasma of the gas by applying the high frequency power to the lower electrode from the power supply unit, performing the deposition process for forming the thin film on the substrate by the plasma, measuring a temporal variation in the reflection light intensity monitored by the optical device during the deposition process, and calculating a termination time of the deposition process based on a measurement value.

In accordance with a third aspect of the present invention, there is provided a storage medium storing a program for executing, on a computer, a substrate processing method of performing a process on a substrate disposed on a lower electrode, by generating a plasma of gas by way of applying a high frequency power between an upper electrode and the lower electrode installed to face each other in a processing chamber that is capable of being depressurized, wherein the method includes performing a deposition process of depositing a thin film on the substrate while depressurizing the inside of the processing chamber and introducing the gas thereinto; and, while the deposition process is being performed, irradiating light that is transmitted through a monitoring window installed in the processing chamber, toward the inside of the processing chamber through the monitoring window, and monitoring a reflection light intensity of reflection light by receiving the reflection light through the window.

Further, the substrate processing method of the third aspect of the invention further includes measuring a temporal variation in the reflection light intensity during the deposition process and calculating a termination time of the deposition process based on a measurement value of the temporal variation; and terminating the deposition process by setting the termination time as an end point of the deposition process.

BRIEF DESCRIPTION OF THE DRAWINGS

The above and other objects and features of the present invention will become apparent from the following description of embodiments given in conjunction with the accompanying drawings, in which:

FIG. 7 provides a flowchart for describing a deposition process in accordance with the embodiment of the present invention;

FIG. 8 presents a table showing specific examples in order to describe a method for calculating a terminal time of the deposition process in accordance with the embodiment of the present invention;

DETAILED DESCRIPTION OF THE EMBODIMENTS

Figure 1:
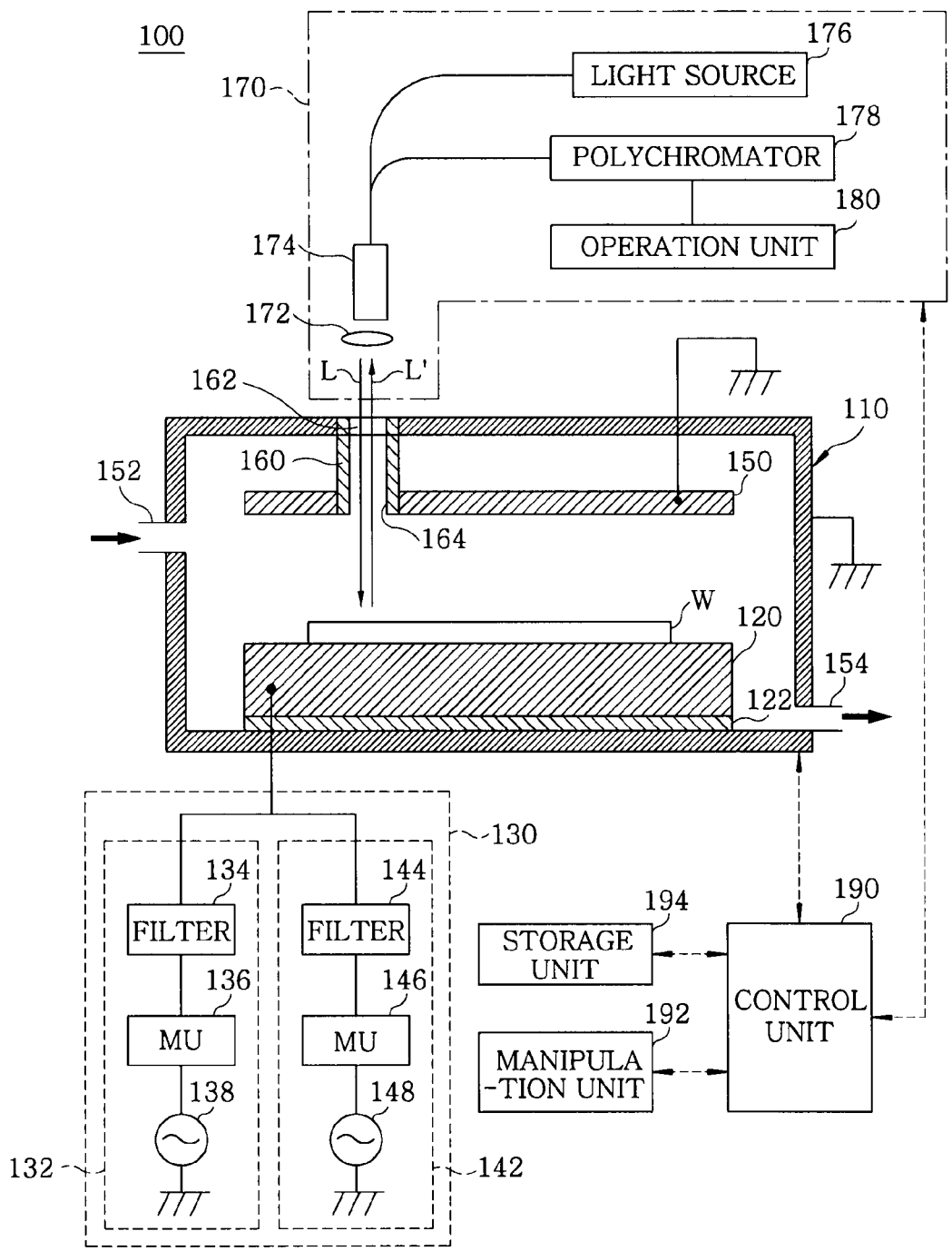
FIG. 1 is a cross sectional view of a plasma processing apparatus in accordance with an embodiment of the present invention.

Hereinafter, embodiments of the present invention will be described in detail with reference to the accompanying drawings which for a part hereof. Through the whole document, parts having substantially like function and configuration will be assigned like reference numerals, and redundant description thereof will be omitted.

(Configuration Example of Substrate Processing Apparatus)

First, a configuration example of a substrate processing apparatus in accordance with an embodiment of the present invention will be described with reference to the drawings. Here, a plasma processing apparatus, which performs etching on an etching target film formed on a wafer by superposing and applying a first high frequency power (high frequency power for generating plasma) having a relatively high frequency of, e.g., about 40 MHz and a second high frequency power (high frequency power for generating a bias voltage) having a relatively low frequency of, e.g., about 3.2 MHz to a single electrode (lower electrode) serving also as a mounting table, will be explained as the substrate processing apparatus.

FIG. 1 is a cross sectional view approximately presenting the plasma processing apparatus in accordance with the embodiment of the present invention.

As illustrated in FIG. 1, the plasma processing apparatus 100 includes a processing chamber 110 made of a conductive material such as aluminum. The processing chamber 110 is grounded. A lower electrode (susceptor) 120 also serving as a mounting table for mounting a wafer W thereon is installed in a bottom portion of the processing chamber 110 via an insulating member 122. Further, the lower electrode 120 is maintained at a preset temperature by a non-illustrated temperature control mechanism, and a heat transfer gas is supplied between the wafer W and the lower electrode 120 from a non-illustrated heat transfer gas supply mechanism at a preset pressure.

A power supply unit 130 for supplying two frequency superposed powers to the lower electrode 120 is connected to the lower electrode 120. The power supply unit 130 includes a first high frequency power supply mechanism 132 for supplying the first high frequency power (high frequency power for generating the plasma) having a first high frequency and a second high frequency power supply mechanism 142 for supplying the second high frequency power (high frequency power for generating the bias voltage) having a second frequency.

The first high frequency power supply mechanism 132 includes a first filter 134, a first matching unit (MU) 136 and a first power supply 138 connected in sequences from the lower electrode 120. The first filter 134 prevents components of second high frequency power from entering into the first matching unit 136. The first matching unit 136 has first high frequency power components matched. The first high frequency is, e.g., about 40 MHz.

The second high frequency power supply mechanism 142 includes a second filter 144, a second matching unit (MU) 146 and a second power supply 148 connected in sequences from the lower electrode 120. The second filter 144 prevents components of the first high frequency power from entering into the second matching unit 146. The second matching unit 146 has the second high frequency power components matched. The second high frequency is, e.g., about 3.2 MHz.

An upper electrode 150 is provided above the lower electrode 120 to face it with a certain gap. The upper electrode is grounded. A gas supply port 152 connected to a gas supply source (not shown) is provided at an upper sidewall portion of the processing chamber 110. A processing gas such as a deposition processing gas, an etching processing gas and the like, which is necessary for wafer processing, is supplied through the gas supply port 152.

A gas exhaust port 154 connected to a gas exhaust apparatus (not shown) (e.g., a vacuum pump or the like) is provided at a lower sidewall portion of the processing chamber 110. By evacuating the processing chamber 110 via the gas exhaust port 154 by operating the gas exhaust apparatus, the inside of the processing chamber 110 can be depressurized to a preset vacuum pressure.

Further, though not shown, a gate valve is provided via a wafer loading/unloading port in the sidewall of the processing chamber. When the gate valve is opened, a wafer can be loaded into or unloaded from the processing chamber by a non-illustrated transfer mechanism such as a transfer arm.

A cylindrical observation unit 160 is installed so as to be extended from a ceiling portion of the processing chamber 110 into the upper electrode 150. A monitoring window 162 made of a transparent material such as quartz glass is fixed to an upper end of the observation unit 160. A lower end of the observation unit 160 is inserted into a through hole 164 of the upper electrode 150.

An optical device 170 is connected to the observation unit 160, which is coupled to an optical fiber 174 via a condensing lens 172. A base end of the optical fiber 174 is branched off into two: one is connected to a light source 176 while the other is connected to a polychromator 178. An operation unit 180 is connected to the polychromator 178, which standardizes and monitors an intensity of reflection light received via the polychromator 178. Further, a specific example for the standardization of the reflection light intensity will be described later.

The light source 176 is selected from those capable of irradiating white light. For example, a xenon lamp, a tungsten lamp or the like may be used as the light source. Further, the reflection light received via the polychromator 178 desirably is of a wavelength with which at least a film thickness of a deposit accumulated on the window 162 can be measured. For example, in case that the deposit is a CF-based film containing a carbon atom C and a fluorine atom F, it is desirable to receive reflection light of a wavelength ranging from about 200 nm to 300 nm (e.g., 229 nm).

Each component of the plasma processing apparatus 100 is connected to and controlled by a control unit (which controls an entire operation of the apparatus) 190. Further, connected to the control unit 190 is a manipulation unit 192 including a keyboard with which a process manager inputs a command to manage the plasma processing apparatus 100, a display which visualizes and displays an operational status of the processing apparatus 100, and the like.

Further, also connected to the control unit 190 is a storage unit 194 which stores a program for performing various processes by controlling each component of the plasma processing apparatus 100, recipe data which is necessary for executing the program, and the like.

The storage unit 194 stores therein process recipes for performing various processes such as a deposition process and an etching process on the wafer W, a process recipe for performing a cleaning process, and so forth. The process recipe includes parameter values such as control parameters for controlling each component of the plasma processing apparatus 100, setup parameters, and so forth. For example, a process recipe may have parameter values such as a flow rate of a processing gas, an internal pressure in the processing chamber, power levels of the first and second high frequency powers, and the like. Besides, data to be used in calculating a termination time of the deposition process in accordance with the embodiment of the present invention is also previously stored in the storage unit 194.

Further, such process recipes may be stored in a hard disk or a semiconductor memory, or may be set at a preset position in the storage unit 194 while being recorded on a portable computer-readable storage medium such as a CD-ROM, a DVD, or the like.

If necessary, the control unit 190 reads a recipe out of the storage unit 194 in response to, e.g., an instruction from the manipulation unit 192 and controls each component in accordance with the recipe, whereby a desired process is carried out in the plasma processing apparatus 100. Further, the recipe can be edited by using the manipulation unit 192.

Figure 2:
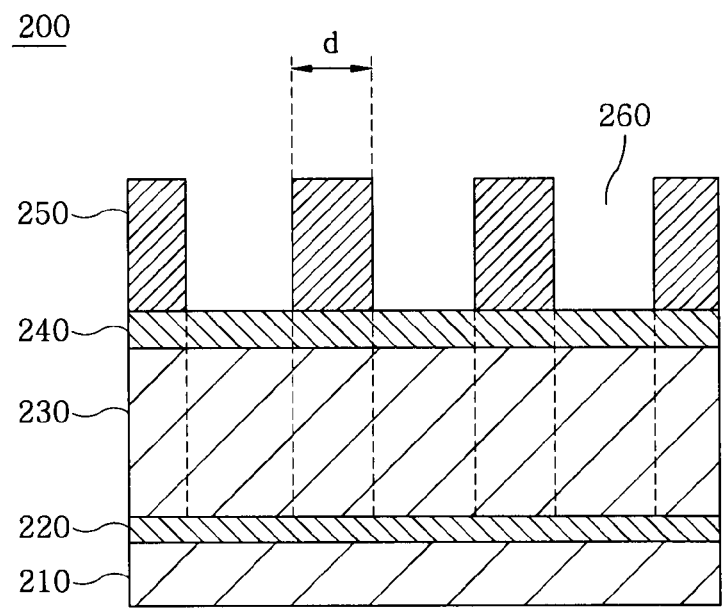
FIG. 2 is a diagram showing an example of a wafer film structure before an etching process is performed.
Figure 3:
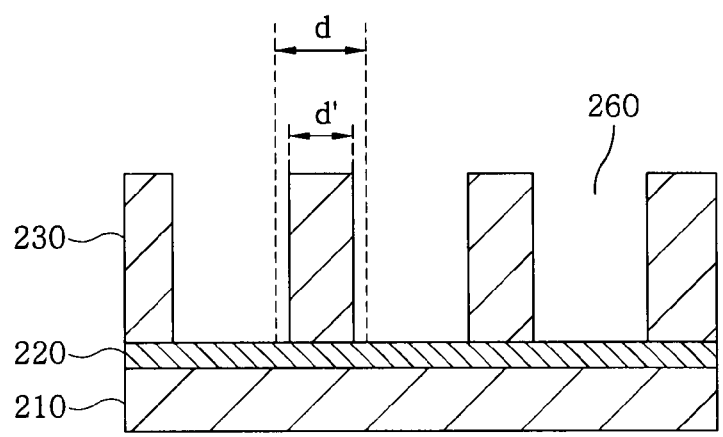
FIG. 3 sets forth a diagram showing an example of a wafer film structure after the etching process is performed.

Hereinafter, a process performed on a wafer W by using the plasma processing apparatus 100 having the above-described configuration will be explained with reference to the accompanying drawings. Here, the description will be provided for an example of performing an etching process on a wafer W having a film structure 200 as illustrated in FIG. 2, thus forming a pattern of trenches in an etching target film 230 as shown in FIG. 3. The film structure 200 shown in FIG. 2 includes an oxide film 220, the etching target film 230, an antireflection film 240 and a resist pattern 250 sequentially deposited on a silicon (Si) substrate 210. The resist pattern 250 is provided with a pattern of openings 260 for forming trenches.

When the etching target film 230 on the wafer W is etched, the antireflection film 240 is first etched by using the resist pattern 250 as a mask, and the etching target film 230 is subsequently etched. Thereafter, residues of the antireflection film 240 and resist pattern 250 are removed, so that trenches as shown in FIG. 3 can be obtained.

At this time, if the etching process is directly performed on the film structure 200 of the wafer W, an opening dimension of the resist pattern may be enlarged or a critical dimension of a hole or a trench (e.g., a diameter of the hole or a line width of the trench) may deviate from a target value due to over-etching of a sidewall of a recess in a film to be etched. It results in a failure to obtain device characteristics as designed.

Therefore, in the present embodiment, prior to performing the etching process, the opening dimension of the resist pattern 250 is reduced by performing a deposition process for accumulating a deposit on the resist pattern 250, and then the etching process is conducted. In the present embodiment, the deposition process and the etching process are consecutively performed for every single sheet of a plurality of (e.g., 25 sheets in one lot) wafers W.

In such case, however, even if the deposition process of each wafer W is performed for the same period of time, progress of deposition onto the wafer W may be subtly varied depending on a condition within the processing chamber 110 or the like when the wafer W is processed. Thus, a difference in opening dimensions of resist patterns may be generated, which in turn causes a minute deviation of about several nanometers in CD values (line widths) of trenches formed after the etching.

To prevent such a deviation in the CD values, if a film thickness of the deposit on the wafer W could be monitored during the deposition process by way of irradiating light through the monitoring window 162 by the optical device 170 and then monitoring its reflection light, a processing time of the deposition process could be controlled. Actually, however, it is very difficult to directly monitor the film thickness of the deposit on the wafer W during the deposition process. It is because the deposit is accumulated on an inner wall of the processing chamber 110 and an inner side of the window 162 as well as on the wafer W, so that the reflection light from the substrate cannot be detected accurately due to the presence of such deposits.

During the deposition process, however, since the deposition onto the window 162 also progresses as the deposition onto the wafer W is performed, there is a correlation between them. Besides, the progress of deposition onto the window 162 can be readily monitored based on a variation of reflection light when light is irradiated to the window 162 by the optical device 170.

Based on this observation, the present inventors have conducted experiments repeatedly and finally found out that a temporal variation (gradient) in the reflection light intensity measured by the optical device 170 differs every time each wafer W is processed and there is a certain correlation between the temporal variation in the reflection light intensity and a CD variation (here, a variation in line widths) of the trenches formed after the etching process.

Figure 4:
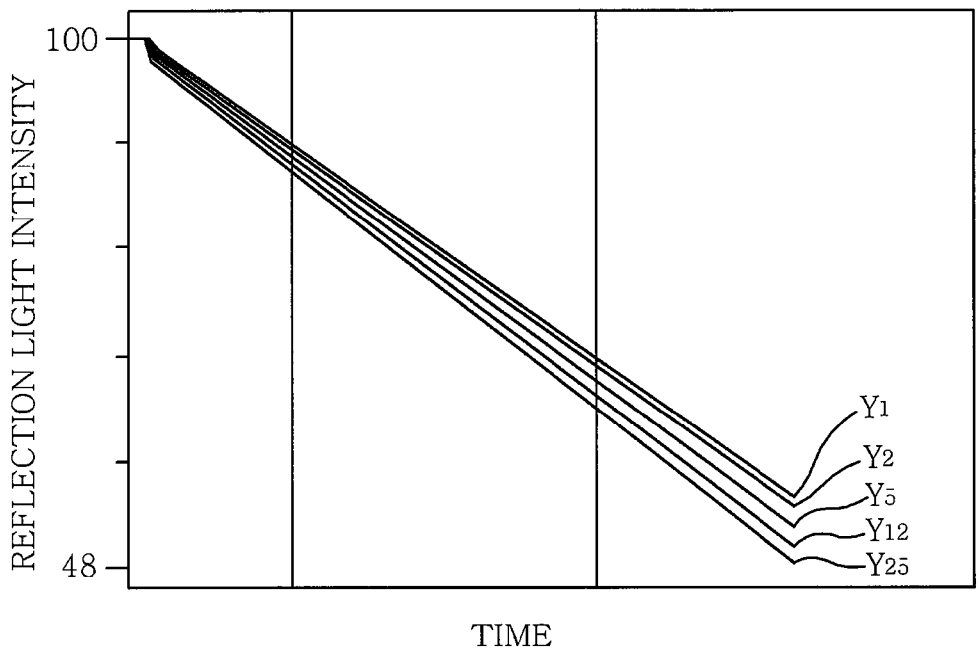
FIG. 4 presents a graph showing temporal variations in reflection light intensities when a deposition process is performed on respective wafers.

Here, the experiment results will be explained with reference to the accompanying drawings. In this experiment, after performing a deposition process on every single sheet of 25 wafers W in one lot for the same period of time, an etching process was performed to form trenches, and a CD value (here, line width) of each trench was measured. FIG. 4 is a graph showing temporal variations in the reflection light intensities in the processing of the $1^{st}$, $2^{nd}$, $5^{th}$, $12^{th}$ and $25^{th}$ wafers W. In FIG. 4, a vertical axis represents the reflection light intensity, and a horizontal axis indicates a processing time. Here, when an average of reflection light intensities for an initial stage of the deposition process, i.e., for the first several seconds, is set as 100 of a reference value, the magnitude of the reflection light intensity is a ratio of a reflection light intensity to the reference value.

Figure 5:
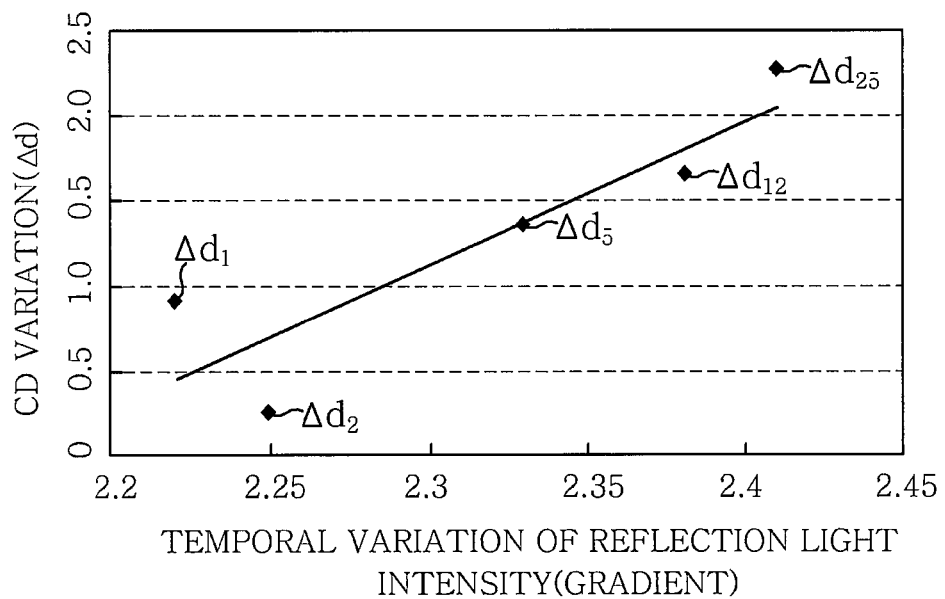
FIG. 5 provides a graph showing a correlation between a CD variation with respect to a target CD value after the etching and a temporal variation (gradient) in the reflection light intensity in each wafer shown in FIG. 4.

FIG. 5 is a graph on which the temporal variations (gradients) in the reflection light intensities in the processing of the $1^{st}$, $2^{nd}$, $5^{th}$, $12^{th}$, and $25^{th}$ wafers W shown in FIG. 4 and CD variations $\Delta d1$, $\Delta d2$, $\Delta d5$, $\Delta d12$, and $\Delta d25$ of the trenches formed after the etching are plotted, which shows a correlation between them. Further, a CD variation $\Delta d$ shown in FIG. 5 is calculated from a formula $\Delta d = d' - d$, wherein a target CD value of a trench is d and an actual CD value after the etching is d', as illustrated in FIG. 3.

As can be seen from the experiment result provided in FIG. 4, the temporal variations in the reflection light intensities are linear, and their gradients tend to increase gradually as the processing of the wafers W proceeds from the $1^{st}$, to the $2^{nd}$, $5^{th}$, $12^{th}$ and $25^{th}$ wafers W. Besides, from the experiment result shown in FIG. 5, it is found out that there is a certain correlation between the temporal variations (gradients) in the reflection light intensities and the CD variations of the trenches formed after the etching.

The reason for this is deemed to be as follows. As the processing is repeated on from the $1^{st}$ wafer W to the next, conditions within the processing chamber 110 and the like comes to be gradually stabilized. Thus, accumulation of the deposit on a later-processed wafer W may become easier than accumulation on a first-processed wafer W. Accordingly, a deposit amount may increase, whereby the opening dimensions of the resist patterns may be reduced, thus resulting in an increase of the CD values (line widths) of the trenches.

Accordingly, in the present embodiment, based on the correlation between the temporal variations (gradients) in the reflection light intensities and the CD variations of the trenches, an optimal termination time of the deposition process may be calculated from a temporal variation (gradient) in a reflection light intensity measured by the optical device 170 during the deposition process. In this way, the film thickness of the deposit on the wafer W can be controlled. Further, a deviation in the opening dimensions of the resist patterns can be prevented, and, thus, a deviation in the CD values of the trenches formed after the etching can be avoided as well.

(Example of Wafer Processing)

Now, wafer processing including the deposition process in accordance with the embodiment of the present invention, which is performed by the plasma processing apparatus 100, will be explained with reference to the accompanying drawings. Here, an etching process is performed after a deposition process for accumulating a deposit 270 on a resist pattern 250 having trench-shaped openings 260 is performed on a wafer W having a film structure 200 as shown in FIG. 2. Then, by performing an ashing process, a trench is obtained.

Schematic diagrams showing film structures in respective processing steps are provided in FIGS. 6A to 6D. FIG. 7 presents a flowchart to schematically describe the deposition process in accordance with the present embodiment. Here, the wafer processing is performed under the control of the control unit 190 which controls each component of the plasma processing apparatus 100 based on a program.

(Deposition Process)

First, the wafer W is loaded into the processing chamber 110, and a deposition process is performed on the wafer W. As described in FIG. 7, while the deposition process is being performed, a reflection light intensity is monitored by the optical device 170 in a step S110. Specifically, the inside of the processing chamber is depressurized to a preset vacuum pressure, and a deposition processing gas (e.g., a $CH_4$ gas and a $CF_4$ gas) is supplied into the processing chamber 110. Then, by applying the first and second high frequency powers to the lower electrode 120, the processing gas is converted into plasma. Accordingly, the deposition process is started, and a deposit including, e.g., C and H is begun to be accumulated on the wafer W.

At this time, the optical device 170 irradiates light L to the inside of the processing chamber 110 through the window 162, receives reflection light L' thereof, and monitors a temporal variation in the intensity of the reflection light L'. In this case, an average of refection light intensities in an initial stage of the deposition process, i.e., for the beginning several seconds (e.g., 3 to seconds), may be calculated, and a reflection light intensity normalized based on this average value may be monitored.

For example, as illustrated in FIG. 4, the average of the reflection light intensities for the beginning several seconds of the deposition process may be set as 100 of a reference value, and a ratio of a reflection light intensity to this reference value may be set as a normalized reflection light intensity. In this way, without being affected by a temporal variation in luminous intensity of the light source 176 or the like, a variation in the reflection light intensity can be monitored.

Subsequently, a temporal variation (gradient) in the reflection light intensity is measured in a step S120. The reflection light intensity decreases linearly as the processing time of the deposition process elapses, as shown in FIG. 4, because the deposit is gradually accumulated on the window 162 as the deposition process progresses. Accordingly, the temporal variation (gradient) of the reflection light intensity can be calculated from a temporal variation in a reflection light intensity for a period of time (e.g., several seconds to less than 20 seconds).

Subsequently, in a step S130, a termination time of the deposition process is calculated based on a measurement value of the temporal variation (gradient) in the reflection light intensity. Here, a correlation between temporal variations in the reflection light intensities and CD variations, as shown in FIG. 5, which is calculated when a series of processes including the deposition process is performed on wafers W for a predetermined period of time, is previously stored in the storage unit 194, and the termination time is calculated based on the correlation.

Specifically, with respect to one of the wafers W, an adjustment time for allowing a CD value of this wafer to reach a target value is set as a reference adjustment time. A CD variation per second is calculated from this reference adjustment time, and based on this calculation result, an adjustment time for another wafer W according to a temporal variation in a reflection light intensity thereof is calculated. The termination time is calculated by adding the adjustment time to the set time.

Here, an example of calculation of the termination time will be illustrated in FIG. 8, when the $25^{th}$ wafer having a largest CD variation is taken as a reference and it is assumed that the reference adjustment time of the $25^{th}$ wafer is 30 seconds. Here, since the reference adjustment time is 30 seconds, the CD variation per second is about 0.075(=2.27/30). For example, the adjustment time of the $12^{th}$ wafer W is calculated as 30.4 seconds, by dividing the difference (=0.03) between temporal variations (gradients) in reflection light intensities of the $25^{th}$ wafer W and the $12^{th}$ wafer by the CD variation per second (=0.075), and adding the reference adjustment time of 30 seconds to the resultant.

And then, by adding the adjustment time to the set time, the termination time of the $12^{th}$ wafer W is calculated. However, the method for calculating the termination time of the deposition process is not limited to the above-described example.

Figure 6A:
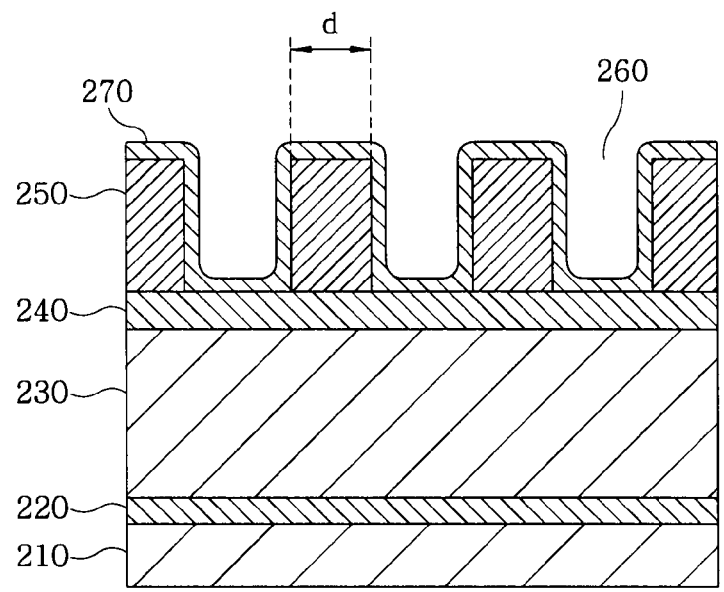
FIG. 6A is a diagram showing a film structure after a deposition process when a trench is formed in an etching target film on a wafer.

Then, in a step S140, the deposition process is finished at the termination time calculated as described above. As a result, the deposit 270 is accumulated on the wafer W in an appropriate thickness, as illustrated in FIG. 6A. The deposit 270 is accumulated on a top portion of the resist pattern 250 as well as on a sidewall of the opening 260 or a bottom portion thereof where an antireflection film 240 is exposed, in an appropriate thickness. In this way, by adjusting the opening 260 of the resist pattern 250, a dimension of a protruding portion can be adjusted.

(Etching Process)

Subsequently, an etching process is consecutively performed on the wafer W on which the deposit 270 is accumulated. In this etching process, first of all, an antireflection film 240 is etched by using the resist pattern 250 as a mask, and an etching target film 230 is etched thereafter. In the etching process of the antireflection film 240, the internal pressure of the processing chamber 110 is controlled, and an etching gas, e.g., a $CF_4$ gas, is supplied.

Figure 6B:
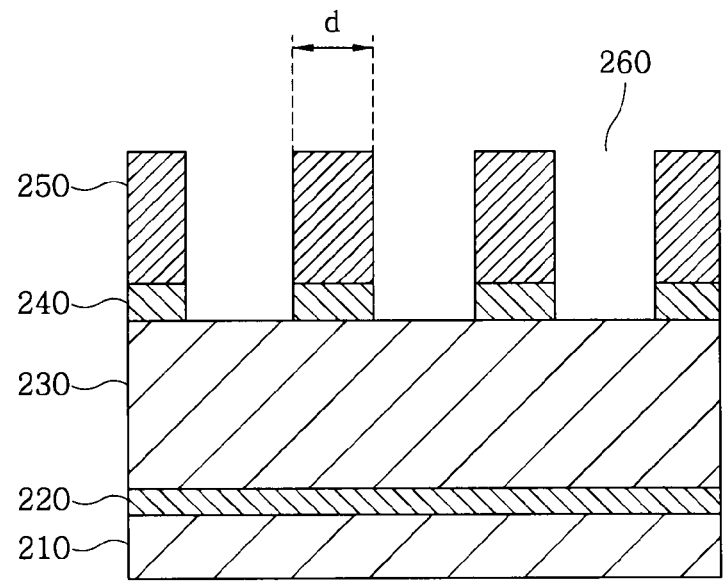
FIG. 6B depicts a diagram showing a film structure after etching of an antireflection film is performed on the film structure shown in FIG. 6A.

Then, by applying the first and second high frequency powers to the lower electrode 120, a plasm of the processing gas is produced. The antireflection film 240 is etched by this plasma. Since the antireflection film 240 and the deposit 270 are all organic films, an exposed portion of the deposit 270 will be etched when the etching of the antireflection film 240 is performed. As a result, the dimension of the protruding portion is reduced to d, as shown in FIG. 6B.

In the present invention, since there is performed the etching process consecutively after the deposition process is ended at the termination time, the substrate doesn't have to be unloaded from the substrate processing apparatus and a thickness of the deposit can be measured where it is. Therefore, a variation of CD can be suppressed more accurately in a structure formed on the substrate without lowering a throughput of process.

Figure 6C:
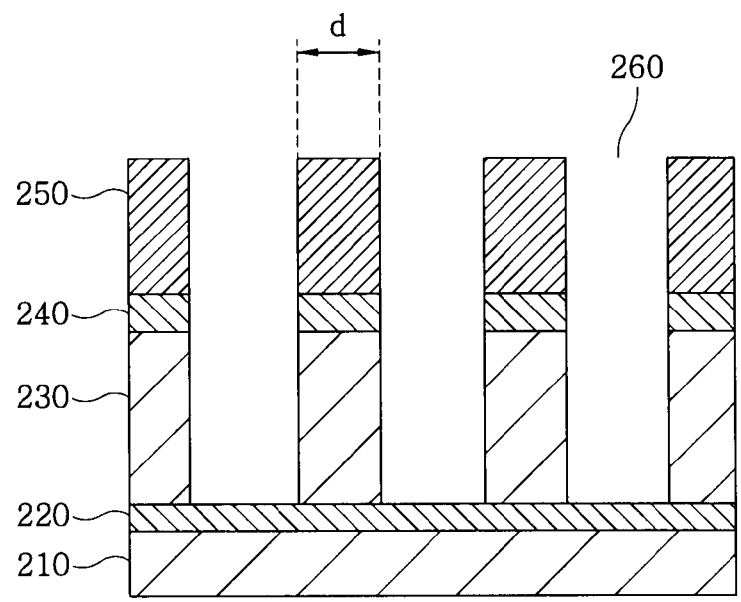
FIG. 6C offers a diagram showing a film structure after etching of the etching target film is performed on the film structure shown in FIG. 6B.

Subsequently, in the etching process of the etching target film 230, a gaseous mixture of, e.g., a $CH_3$ gas, a $CF_4$ gas and an Ar gas is supplied as an etching gas in case that the etching target film 230 is made of, e.g., a SiN film, and plasma of the processing gas is generated by applying the first and second high frequency powers to the lower electrode 120. The etching target film 230 is etched by this plasma, as illustrated in FIG. 6C, so that a trench is obtained.

Figure 6D:
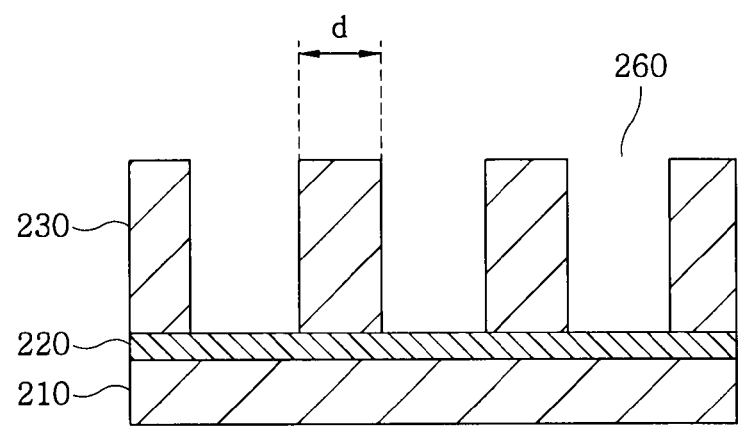
FIG. 6D is a diagram showing a film structure after ashing is performed on the film structure shown in FIG. 6C.

Upon the completion of the etching process, all remained resist pattern 250 and antireflection film 240 are eliminated by performing an ashing process, so that a trench having a desired CD value (line width d) is obtained, as illustrated in FIG. 6D.

As described, in the present embodiment, by adjusting the termination time of the deposition process by way of indirectly monitoring the amounts of deposits 270 accumulated on wafers W in the deposition process, a variation in deposition amounts of the deposits 270 on the respective wafers W can be suppressed when the deposition process of each wafer W is performed. Accordingly, since a deviation in CD variations of trenches formed after the etching can be suppressed, trenches can be formed on each wafer W as designed.

Further, though the present embodiment has been described for the case of forming the trench having a designed CD value by accumulating the deposit 270 by an amount equivalent to a widening amount of the opening 260 of the resist pattern 250 due to etching of the antireflection film 240, the present invention is not limited thereto. For example, the present invention can also be applied to a case of accumulating the deposit 270 on the wafer having the film structure 200 as illustrated in FIG. 2 such that the opening 260 of the resist pattern 250 is narrowed by a certain dimension capable of producing a narrower trench pattern.

In such case, by calculating the termination time of the deposition process for each wafer W, a deviation in deposition amounts of the deposits 270 can also be suppressed. In this way, since a deviation in CD variations of trenches formed after the etching can be suppressed, the trenches can be formed on each wafer W as designed.

Further, the present invention can also be applied to formation of a hole on the wafer W instead of the trench. Hereinafter, a series of processes performed on the wafer W, in case the opening 260 of the resist pattern 250 in the film structure 200 shown in FIG. 2 is formed in a hole shape, will be explained with reference to the accompanying drawings.

Figure 9A:
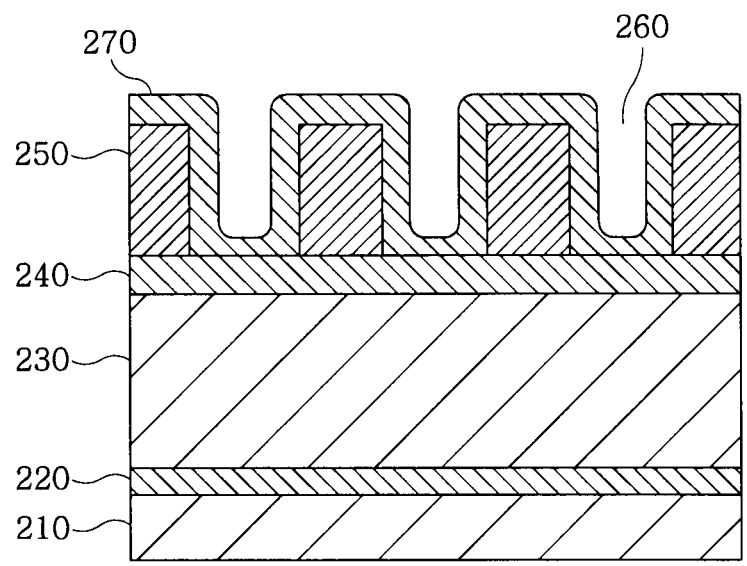
FIG. 9A depicts a diagram showing a film structure after a deposition process when a hole is formed in an etching target film on a wafer.
Figure 9B:
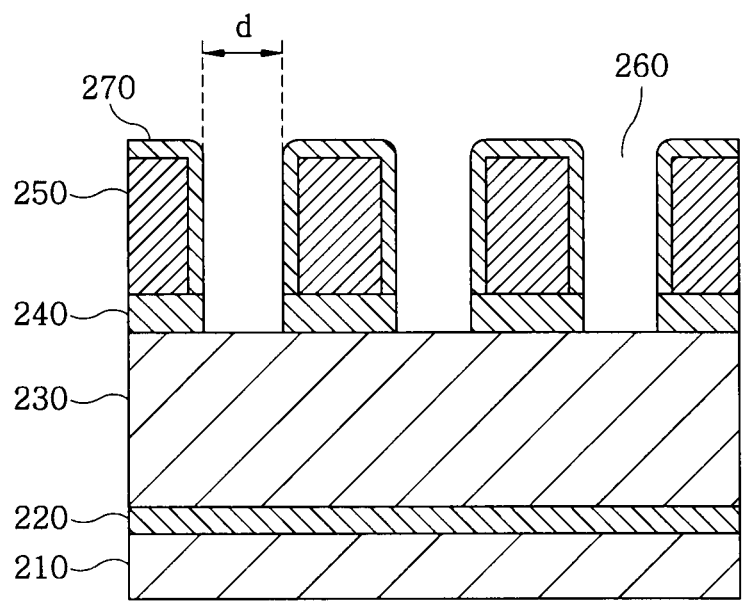
FIG. 9B depicts a diagram showing a film structure after etching of an antireflection film is performed on the film structure shown in FIG. 9A.
Figure 9C:
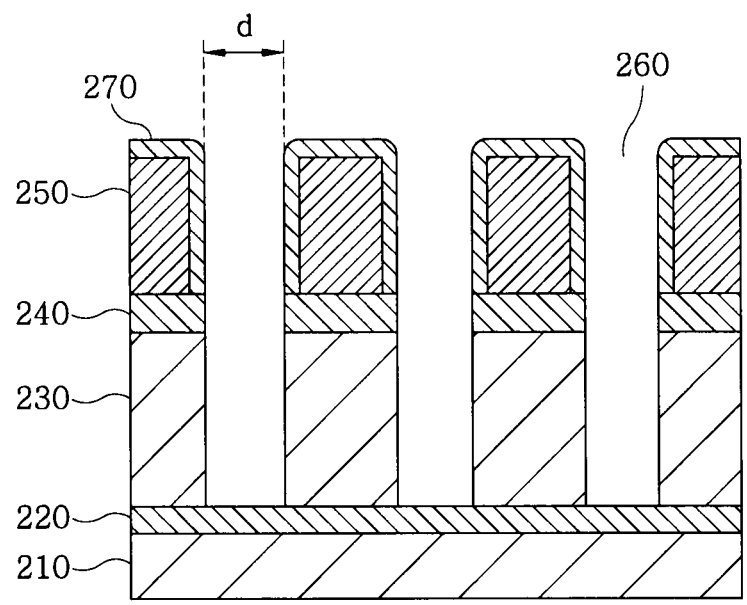
FIG. 9C offers a diagram showing a film structure after etching of the etching target film is performed on the film structure shown in FIG. 9B.
Figure 9D:
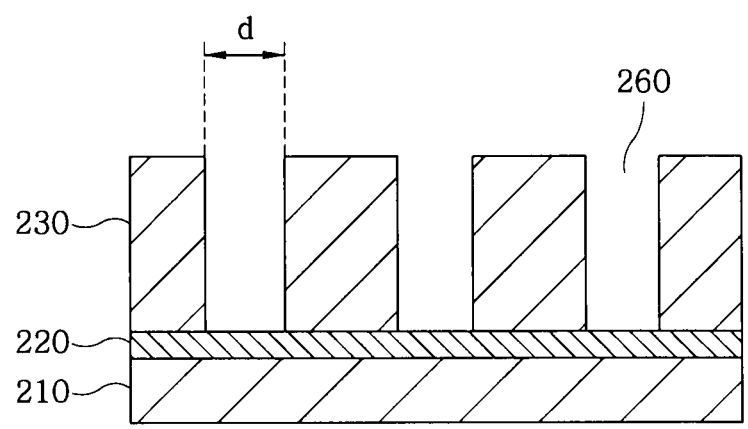
FIG. 9D is a diagram showing a film structure after ashing is performed on the film structure shown in FIG. 9C.

FIGS. 9A to 9D provide schematic diagrams showing film structures in respective processing steps for forming a hole on the wafer W. FIG. 9A shows a film structure after a deposition process, and it corresponds to FIG. 6A. FIG. 9B illustrates a film structure after the etching of the antireflection film 240, and it corresponds to FIG. 6B. Further, FIG. 9C shows a film structure after the etching of the etching target film 230, and it corresponds to FIG. 6C. FIG. 9D illustrates a film structure after an ashing process, and it corresponds to FIG. 6D.

In process of hole formation, first of all, a thick deposit 270 is accumulated by performing the above-described deposition process shown in FIG. 7. Therefore, since some of the deposits 270 still remain even after the antireflection film 240 is etched as illustrated in FIG. 9B, a hole smaller than the dimension of the opening 260 of the resist pattern 250 can be obtained. Thus, the dimension d smaller than that of the opening 260 of the resist pattern 250 may be set as a target CD value of the hole. By performing the etching process of the etching target film 230 in this state, etching can be carried out by using a narrower opening 260 as shown in FIG. 9C, so that a CD value (diameter) of the hole can be reduced as illustrated in FIG. 9D. Accordingly, a hole having a diameter smaller than that of the opening of the resist pattern 250 can be formed.

Further, in such case, by calculating a termination time of the deposition process of each wafer W, a deviation in deposition amounts of deposits 270 can be suppressed. Thus, since a deviation in CD variations in holes formed after the etching can be suppressed as well, holes can be formed on the respective wafers W as designed. Moreover, in accordance with the present embodiment, since the dimension of the opening 260 of the resist pattern 250 can be controlled more accurately, a designed hole shape can be formed with higher accuracy even when the dimension d smaller than the size of the opening 260 of the resist pattern 250 is set as the target CD value as in the above-stated example.

Moreover, though the deposition process in accordance with the present embodiment has been described for the case of accumulating the deposit on the resist pattern of the wafer W, the present invention is not limited thereto. For example, the deposition process may be a film forming process for depositing a thin film on the wafer W in a preset thickness.

In this case, it is desirable that the termination time is calculated based on a correlation between the temporal variation in the reflection light intensity and a variation in film thickness after the film formation. With such configuration, a thin film can be formed in an appropriate thickness complying with a target dimension of film thickness after an film-forming process is performed, and thereby the thin film of thickness as designed can be formed more accurately on the substrate.

Moreover, though the etching target film is the SiN film in the present embodiment, the present invention is not limited thereto. For example, any thin film capable of being etched using the resist pattern 250 as a mask can be used as the etching target film 230. For example, an oxide film, a TEOS film, a Ti film, a TiN film or the like may be used as the etching target film 230.

Further, a medium, such as a storage medium that stores a program of software for implementing the functions of the aforementioned embodiment, is provided to a system or an apparatus. A computer (or CPU or MPU) of the system or the apparatus reads out the program stored in the medium such as the storage medium, and executes the program so that the present invention can be implemented.

In such case, the program itself read out from the medium such as the storage medium realizes the functions of the aforementioned embodiment, and the medium such as the storage medium storing the program therein is included within the scope of the present invention. For example, a floppy (registered trademark) disk, a hard disk, an optical disk, a magneto-optical disk, a CD-ROM, a CD-R, a CD-RW, a DVD-ROM, a DVD-RAM, a DVD-RW, a DVD+RW, a magnetic tape, a nonvolatile memory card, a ROM, or the like may be used as the medium such as the storage medium for supplying the program. Alternatively, the program may be downloaded in the medium through networks.

Besides the mechanism of directly realizing the functions of the above-described embodiments by executing the program read out by the computer, it is also possible to set an operating system (OS) working on the computer to perform actual processing partially or entirely based on instructions of the program and realize the functions of the aforementioned embodiments through such processing.

In addition, the functions of the aforementioned embodiments can be implemented by recording the program read out from the storage medium on a memory provided in a function extension board inserted in the computer or in a function extension unit connected to the computer; and then allowing the CPU or the like provided in the function extension board or in the function extension unit to perform actual processing partially or entirely based on instructions of the program.

In the above-described embodiments, though the plasma processing apparatus which generates plasma by applying two kinds of high frequency powers only to the lower electrode has been described as the substrate processing apparatus, the present invention may also be applied to a plasma processing apparatus of another type, for example, a plasma processing apparatus which applies one kind of high frequency power only to the lower electrode, a plasma processing apparatus which applies two kinds of high frequency powers to the upper and lower electrodes, respectively, or the like. Moreover, the substrate processing apparatus to which the present invention is applicable is not limited to the plasma processing apparatus. For example, the present invention is also applicable to a heat treatment apparatus that performs a film forming process.

In accordance with the present invention, a deviation of a deposit can be suppressed in an deposition process of each substrate, by irradiating light through a monitoring window, receiving a reflection light thereof, and indirectly monitoring a deposit amount accumulated on the substrate to adjust a termination time of the deposition process.

While the invention has been shown and described with respect to the embodiments, it will be understood by those skilled in the art that various changes and modifications may be made without departing from the scope of the invention as defined in the following claims.

What is claimed is:

1. A method of processing a substrate disposed on a lower electrode adapted to generate plasma of a gas by applying AC power between the lower electrode and an upper electrode in a processing chamber that is capable of being depressurized, the method comprising:
   depositing a thin film on the substrate while depressurizing an inside of the processing chamber and introducing the gas into the chamber;
   transmitting irradiating light, while depositing the thin film, toward the inside of the processing chamber through a monitoring window installed at the processing chamber;
   monitoring a reflection light intensity of reflection light received through the monitoring window;
   measuring a temporal gradient in the reflection light intensity during the deposition;
   calculating a termination time of the deposition of the thin film based on a measurement value of the temporal gradient; and
   terminating the deposition of the thin film by setting the termination time as an end point of the deposition of the thin film,
   wherein the deposition comprises accumulating a deposit on a resist pattern which masks an etching target film formed on the substrate, and
   wherein the calculating the termination time is based on a correlation between the temporal gradient in the reflection light intensity and a variation in a critical dimension of a structure formed by etching the etching target film.

2. The substrate processing method of claim 1, wherein the etching of the etching target film is performed consecutively after the deposition is ended at the termination time.

3. The substrate processing method of claim 2, wherein said monitoring the reflection light intensity includes monitoring a normalized reflection light intensity that is based on an un-normalized reflection light intensity in an initial stage of the deposition.

4. The substrate processing method of claim 1, wherein the deposition includes forming the thin film on the substrate, and the calculating the termination time is based on a correlation between the temporal gradient in the reflection light intensity and a variation in film thickness of the thin film.

5. A substrate processing apparatus for processing a substrate disposed on a lower electrode adapted to generate plasma of a gas by applying AC power between an upper electrode and the lower electrode in a processing chamber that is capable of being depressurized, the apparatus comprising:
   a power supply unit for applying the AC power between the upper electrode and the lower electrode;
   a gas supply unit for supplying the gas into the processing chamber;
   an exhaust unit for evacuating and depressurizing an inside of the processing chamber to a certain pressure;
   a monitoring window installed at the processing chamber;
   an optical device for monitoring through the monitoring window a reflection light intensity of reflection light, wherein the reflection light is a reflection of irradiating light that is transmitted through the monitoring window; and
   a control unit configured to
      cause deposition of a thin film on the substrate while the inside of the processing chamber is depressurized by the exhaust unit and the gas is introduced into the processing chamber by the gas supply unit,
      receive the reflection light intensity from the optical device while the deposition is being performed
      measure a temporal gradient in the reflection light intensity during the deposition,
      calculate a termination time of the deposition based on a measurement value of the temporal gradient, and
      cause the deposition process to terminate by setting the termination time as an end point of the deposition,
      wherein the deposition of the thin film comprises accumulating a deposit on a resist pattern which masks an etching target film formed on the substrate, and
      wherein the control unit is configured to calculate the termination time based on a correlation between the temporal gradient in the reflection light intensity and a variation in a critical dimension of a structure formed by etching the etching target film.

* * * * *